United States Patent [19]

Einbinder

[11] Patent Number: 4,466,872
[45] Date of Patent: Aug. 21, 1984

[54] METHODS OF AND APPARATUS FOR DEPOSITING A CONTINUOUS FILM OF MINIMUM THICKNESS

[75] Inventor: Itamar B. Einbinder, Overland Park, Kans.

[73] Assignee: AT&T Technologies, Inc., New York, N.Y.

[21] Appl. No.: 452,580

[22] Filed: Dec. 23, 1982

[51] Int. Cl.³ .............................................. C23C 15/00
[52] U.S. Cl. ................................. 204/192 R; 204/298; 118/664; 118/665; 118/715; 427/9; 427/10; 427/248.1
[58] Field of Search ...................... 427/9, 8, 10, 248.1; 204/192 R, 298; 118/664, 665, 715

[56] References Cited

U.S. PATENT DOCUMENTS

| | | | |
|---|---|---|---|
| 3,878,085 | 4/1975 | Corbani | 204/298 |
| 4,025,410 | 5/1977 | Stewart | 204/192 R |
| 4,172,020 | 10/1979 | Tisone et al. | 204/192 R |
| 4,388,342 | 6/1983 | Suzuki et al. | 427/9 |

Primary Examiner—Sadie L. Childs
Attorney, Agent, or Firm—W. O. Schellin

[57] ABSTRACT

A film of material (29) is deposited on a substrate (15), as, for example, in a sputtering process, wherein a gas-permeable substrate (73) covers an opening (71) in a process chamber (14) of a passage communicating with a monitoring chamber (52). A monitoring gas is introduced into one of the chambers to diffuse through the gas-permeable substrate (73) into the other of the chambers. Its level of concentration is then monitored in at least one of the chambers while the film is being deposited. As the film deposits on workpiece substrates within the process chamber, the film also deposits on the surface of the gas-permeable substrate. When the film on such gas-permeable substrate forms a continuous surface, diffusion of the monitoring gas from one chamber to the other ceases. Consequently, an increased concentration level of the monitoring gas may be detected in the one chamber and a decreased concentration level may be detected in the other chamber. Such a change in the concentration level of the monitoring gas is a process check to determine the when a continuous film has been deposited.

20 Claims, 2 Drawing Figures

METHODS OF AND APPARATUS FOR DEPOSITING A CONTINUOUS FILM OF MINIMUM THICKNESS

TECHNICAL FIELD

This invention relates generally to depositing a film of material on a surface of a substrate, such as, for example, by sputtering or by vapor deposition. More specifically, the invention relates to depositing a continuous film of material having a nonporous structure of a minimum thickness on a substrate. As will be recognized from the description of the invention, the described methods and apparatus are applicable to various film deposition operations and appear useful not only in determining when continuous films of material are first obtained in a process, but further by making use of obtained data in controlling and optimizing various film deposition parameters.

BACKGROUND OF THE INVENTION

Vapor deposition and sputtering processes are known techniques for depositing very thin layers, commonly termed "films", of various materials on substrates. The thicknesses to which such films are deposited are often measured in Angstrom units (1 Angstrom unit equals $10^{-10}$ meters). Typically, films deposited by sputtering and vapor deposition processes have thicknesses in the order of several hundred to several thousand Angstrom Units. The present invention will be described with respect to a typical, closed chamber sputtering process as a preferred embodiment. However, it should be understood that such description of a specific apparatus is only intended to highlight features of the invention without limiting the scope and application of the invention to the described apparatus.

In the electronics industry, sputter-deposited films are sometimes used to provide metallization patterns for semiconductor devices. Sputter-deposited thin films are also used to provide on substrates, resistive films which are further processed into precision resistors and into conductors on hybrid integrated microcircuits.

In such functional film depositions, as opposed to the deposition of decorative films on dinnerware, for example, not only the precise thickness of a film, but also its quality, namely its density, is of significance. When a deposited film is analyzed by scanning electronmicroscopy, for example, differences in the microstructures of various deposited films can be observed.

The surface of a film may appear smooth and continuous, even though only a relatively thin film, compared to other sputter-deposited films, may have been formed. On the other hand, a comparatively thicker film may show a ragged surface texture as a result of a loosely deposited and porous underlying film structure. A continued sputter deposition on such a film may ultimately yield a smoothly textured, continuous film surface; however, a layer of relatively greater thickness may be necessary to first obtain a layer of a homogeneous microstructure in this latter example.

If a deposited film is to be used as a base material for a conductor or resistor in a microcircuit, strict control over the microstructure in such film is likely to effect production yields. Often such films are formed to a much greater thickness than is necessary to overcome any inconsistencies in the quality of their deposition, as may be caused by inadvertent changes in one or more of any number of deposition process parameters.

One of these parameters which is likely to affect the quality of a deposited film of material is the quality of the underlying surface, typically a highly polished substrate on which the film is deposited. In addition to the quality or surface smoothness of such substrate, the film may be affected by various other apparatus and process parameters.

In a sputtering operation, for example, a chamber is substantially evacuated to an absolute pressure in the range of $10^{-2}$ torr. A gaseous ion source such as argon remains in the chamber between a cathode target and an anode. An electric discharge between the cathode and anode ionizes the gas, and a DC bias directs the ions against the target of the material to be sputtered. Material is eroded from the target by the impinging ions and flies off toward a workholder where it deposits on the workpieces or substrates as a film.

From this brief description of a typical sputtering operation it may appear that several variables such as pressure, temperature, electrical fields and material selections interact, and each of these variables may be modified either by intent or accidentally. Any change in any of the interrelated variables or parameters may, however, bring about a change in the microstructure of the film that is being deposited. At times, the significance of a changed parameter and the effect of such change on the quality of a deposited film may not even be appreciated.

Changes in the film quality may be brought about by a change in the process temperature, by vacuum changes, by changes in the ion density, or by whether or not AC high frequency enhancement currents are applied. Magnetic enhancement fields are often used in sputtering operations. A change in the magnetic field changes current flow and ion flow patterns within the chamber. Such changes are likely to affect the impact speed of deposited material. Consequently, a deposited film of optimum quality is apt to be obtained only when all of these interrelated factors are optimized with respect to each other.

It therefore appears to be highly desirable to have an in-process indicator to verify whether a particular film which is being deposited is of a desired quality or whether a change has occurred, resulting in a film of a quality different from that of a prior lot. When a change in the quality of a film is detected, it may at that point be too late to change some of the parameters of the ongoing process. However, an early indication of a change in the quality of the microstructure of a film may be the only opportunity to detect otherwise hidden defects which ultimately tend to affect the useful life of the product.

SUMMARY OF THE INVENTION

In accordance with the invention, a film of a predetermined material is deposited on a surface of a gas-permeable substrate located in a process chamber. The substrate covers an opening maintaining communication between the process chamber and a monitoring chamber. A monitoring gas is introduced into the monitoring chamber and its concentration level within the chamber is monitored during the period of depositing the film. A sudden change in the concentration level of the monitoring gas in the monitoring chamber is indicative of the film having obtained a continuous or substantially non-porous surface texture, thereby sealing the communicating opening between the monitoring chamber and the process chamber.

BRIEF DESCRIPTION OF THE DRAWING

Various features and advantages of the present invention will be best understood from the following detailed description of a preferred embodiment when read in reference to the accompanying drawing, wherein.

DETAILED DESCRIPTION

The Apparatus and its Operation

Figure 1:
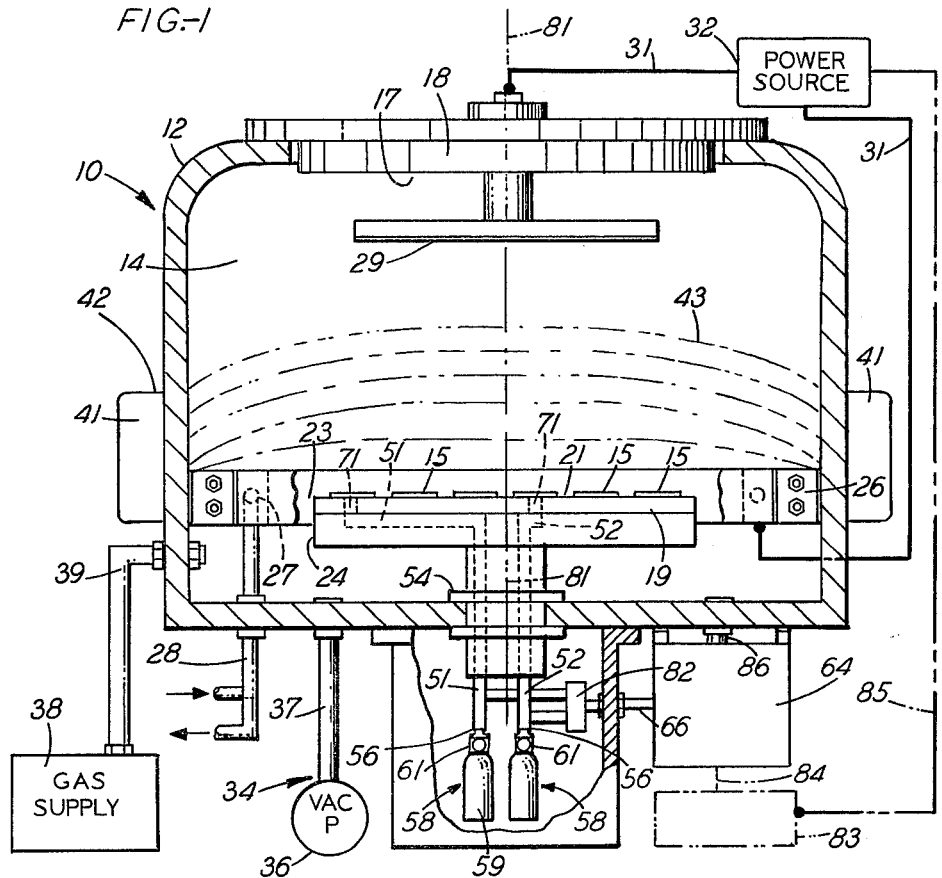
FIG. 1 is a sectional schematic view of a film deposition apparatus including improvements in accordance with the present invention.

Referring now to FIG. 1, there is shown a schematic, sectional view of a film deposition apparatus, such as a sputtering apparatus, designated generally by the numeral 10. Typically, such apparatus employs an evacuable enclosure 12 about a process chamber, or in case of the sputtering apparatus, a vacuum chamber 14.

To prepare the apparatus 10 for operation, workpieces or substrates 15 are loaded into the chamber 14 through a sealable opening typically in either of the sides of the apparatus 10 or, as shown in FIG. 1, through an access opening 17 in the top of the enclosure 12. The opening 17 is then sealed by a lid 18.

The substrates 15 are placed onto a workholder or pallet 19, which may be located in the lower portion of the chamber 14 and which may have a flat, upwardly exposed workholding surface 21, as shown in FIG. 1. However, it should be realized that with respect to the precise structure and operation of the apparatus 10, there are many known structural alternatives available which have been employed with success in various types of sputtering apparatus. For example, some types of apparatus use in lieu of a flat pallet, either a dome-shaped or a barrel-shaped workholder.

As will become apparent from the further description herein, the invention as described applies to, and may be used with, various types of sputtering or film deposition apparatus. A commonly used sputtering apparatus is a continuous process apparatus wherein pallets are introduced at one end through a vacuum lock-type door (not shown) to traverse the apparatus and exit through a second lock-type door. Apparatus described hereunder may be modified to apply to and work with such an in-line sputtering apparatus as well. The depicted apparatus of FIG. 1 in that light is not intended to limit the scope of this invention but to present a pictorial representation of an embodiment thereof, by which the features and advantages of the invention may be best explained.

The pallet 19 itself, in an alternate embodiment, may be an anode in the sputtering circuit of the apparatus 10, or it may be at least part of an anode structure. However, in FIG. 1, an anode 23 is a short cylindrical structure separate from the pallet 19 and is located about a periphery 24 of the pallet 19. The anode 23 is supported in such position within the chamber 14 by a support structure 26 attached to the enclosure 12. The structure 26 preferably further houses a ring-like passage 27 which in turn is coupled to typical supply lines 28 for a coolant.

A cathode or target 29 is suspended from the lid 18 above the pallet 19. An electrical circuit 31 including a typical power source 32 couples the anode and the target into a functional sputtering circuit. The power source 32 typically provides a DC bias and the capability of a high frequency AC signal superimposed on the DC sputtering bias voltage.

For any sputtering action to become initiated, the chamber 14 is evacuated by a vacuum system 34 wherein a vacuum pump 36 communicates with the chamber 14 through vacuum lines 37 opening into the chamber 14. A gas supply 38 introduces a gaseous ion source such as argon through a supply duct 39 into the chamber 14. Of course, the supply 38 including the duct 39 may be integrated with the vacuum system 34.

The apparatus 10 preferably further includes magnetic ion enhancement, achieved through electro-magnets 41, which are mounted in a ring-like structure 42 about the periphery of the enclosure 12. Polarities of the electromagnets 41 are arranged to permit the magnetic flux lines to extend into the enclosure 12 in a manner where the lines 43 would be crossed by ions and electrons in their path between the electrodes 29 and 23. Magnetic deflection of the electrons by the magnetic flux lines 43 lengthens the paths of the electrons and enhances the amount of ionization of the gas for any given current flow.

Monitoring the Film Deposition

Referring again to FIG. 1, the apparatus 10 further shows passage-like monitoring chambers 51 and 52 extending from the top surface 21 of the pallet 19 through a mounting pedestal 54 of the pallet 19 to a monitoring chamber termination 56 which lies external to the evacuable enclosure 12 of the vacuum chamber 14.

In one embodiment, the termination 56 of each of the chambers 51 and 52 is coupled to a supply 58 of a monitoring gas which is preferably helium. The supply 58 is preferably what is known as a sensitivity calibrator or constant leak source. In such a constant leak source, a quantity of helium gas is maintained in a sealed vessel 59. The vessel has a release valve 61 which, when opened, releases helium from the vessel at a constant, known and calibrated rate. The opening of the valve 61 is coupled to one of the respective monitoring chambers 51 or 52. Thus, when the valve 61 is opened, helium is released into each of the chambers at a known rate. The amount of helium released from the supplies 58 is extremely small in terms of volume, inasmuch as the amount may be measured in terms of atoms per second or in terms of cubic centimeters per year. A preferred rate of leakage for release into the monitoring chambers 51 and 52 is, for example, a source calibrated at a leakage rate of $8 \times 10^{-4}$ cm$^3$/year.

As shown in FIG. 1, a helium leak detector 64 is coupled to the monitoring chamber 52. Helium leak detectors are commercially available measuring instruments, such as a mass spectrometer type leak detector, which is available from Veeco Instruments, Inc., in Melville, N.Y. Such leak detectors typically include a pump which draws in a gas through a duct, such as an intake duct 66 coupled to the monitoring chamber 51 or 52. A sensor then quantitatively determines the mass and hence the number of helium atoms present in the sample of the gas.

As previously described, the vacuum chamber 14 remains in communication with the vacuum system 34 throughout the film deposition process. Typically, a vacuum in the chamber 14 is regulated to a value in the range of $10^{-2}$ torr. Also during the process of depositing a film of material on the substrates, each of the monitoring chambers, such as the monitoring chambers 51 and 52, remain in communication with the vacuum chamber 14, as it is best explained in reference to FIG. 2.

Figure 2:
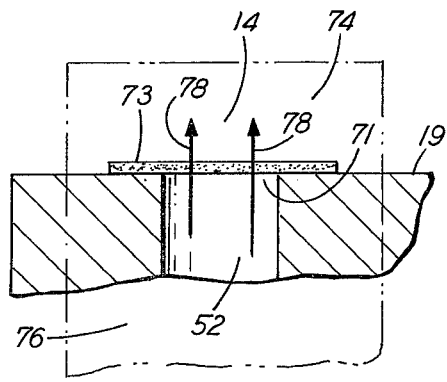
FIG. 2 is an enlarged portion of the schematic view of the apparatus of FIG. 1 showing in greater detail a communicating opening between a vacuum chamber and a monitoring chamber of the apparatus.

FIG. 2 shows a portion of the pallet 19 and particularly an inner opening 71 of the monitoring chamber 52 to the vacuum chamber 14. The monitoring chamber 52 is representative of any other monitoring chambers, particularly as shown in FIG. 1, such as the monitoring chamber 51.

As will become apparent from the description of the function of the representative monitoring chambers 51 and 52, the advantages described herein are derived from the use of at least one monitoring chamber. An advantage of the presence of the chamber 51 in addition to the chamber 52 is, in part, one of redundance and, in part, one of monitoring the film deposition process in different parts of the pallet 19. The function and advantages of the monitoring chambers in general are, therefore, further explained specifically in reference to the monitoring chamber 52.

As shown in FIG. 2, the opening 71 of the monitoring chamber 52 is covered by a gas-permeable test substrate 73. The substrate is intentionally selected to be of a material which is porous to gaseous substances, yet the surface of the substrate is capable of supporting solid deposits. The substrate 73 is consequently capable of supporting deposited thin films of materials of substantially similar microscopic structure as that of the films formed on the substrates 15.

A material of such characteristics is, for example, beryllium oxide, which, even though it yields a smoothly prepared surface, is porous to gases, particularly to helium. Beryllium oxide, also called beryllia, is available in wafer form from firms such as Brush Beryllia, a division of Brush Wellman Inc., Cleveland, Ohio, or Kawecki Berylco Industries, Inc., Reading, Pa. The wafers are typically of square shape, measuring 2.25 inches on each side and having a thickness of 0.012 or 0.020 inch.

As the vacuum chamber 14 is initially evacuated, referring to the space volumes above and below the pallet 19 as set out by phantom lines in FIG. 2, the gas pressure of the atmosphere in a space 74 above the substrate 73 decreases and the atmosphere in a space 76 below the substrate 73 diffuses through the substrate 73, such that the gas pressure within the monitoring chamber 52 remains substantially the same as that in the vacuum chamber 14. The pressure within the vacuum chamber 14 and the monitoring chamber 52 ultimately stabilizes at its working pressure in the range of $10^{-2}$ torr.

The number of atoms of the helium gas leaked at the predetermined rate from the supply 58 are so few relative to the total number of gaseous atoms or molecules remaining in the monitoring chamber at the established partial vacuum pressure, that an equilibrium between the amount of gas leaking from the supply 58 and the diffusing number of gaseous atoms or molecules becomes established and remains constant.

Consequently, at the beginning of the film deposition process, the leak detector 64 coupled through the duct 66 to the chamber 52 (see FIG. 1) detects and indicates the presence of helium at a first level, such level depending, of course, in part, on the geometry of the chamber 52, on the gas pressure of the partial vacuum in the vacuum chamber 14, and on the leak rate of the supply 58. The porosity of the substrate 73 appears to the helium as an opening through which it readily diffuses as indicated by the arrows 78 in FIG. 2.

Because of desirably selected low leak rates of the supply 58, a film 79 which becomes deposited on the substrate 73 will not affect the diffusion of helium atoms through the substrate 73 until such film 79 has grown to a substantially continuous surface structure. At that point in the film deposition process, diffusion of the helium through the diaphragm formed by the substrate 73 becomes impeded and is then substantially eliminated. As a result the level of helium in the monitoring chamber 52 begins to increase suddenly at the same rate as the rate of leakage of helium from the supply 58. The increase of helium in the monitoring chamber 52 is an indication that a continuous film of material has been formed on the test substrate 73. The film now blocks the escape of the gas from the monitoring chamber 52 to the vacuum chamber 14. When the sputtering process is discontinued at this point, the test substrate 73 has a continuous film of minimum thickness of the sputtered material.

Advantages of the Monitoring Process

Unless process or apparatus parameters are altered, the quality of deposited films typically does not vary much between lots. Even though some variations in the films may occur, in a typical, operational metal sputtering process a continuous film of a metal can be expected when the film has reached a thickness of about 50 Angstrom units. However, conductors in microcircuits typically employ sputtered metal film thicknesses in the range of 500 Angstrom units. Therefore, in typical state-of-the-art sputtering processes, continuous layers of sputtered materials are reached even under less than optimum sputter conditions. The advantage of the described monitoring process lies in its ability to establish for various materials optimum sputter conditions. Such optimum conditions appear to be present when a continuous film may be formed with the least material deposition. Subsequent material deposition provides further assurance that the deposited film 79 is, in fact, continuous, and that any additional material is deposited under optimized conditions.

In employing the described process and apparatus, it should also be realized that a continuous film may form on the substrates 15 before a similar film deposited on the test substrates 73, becomes similarly continuous. The film deposited on the substrates 15 or workpieces will then have layers of a continuous film with a greater integrity than the films on the test substrates 73. The converse may also occur, namely, that the film on the workpiece substrates 15 reaches a continuous surface structure after the film formed on the test substrates 73 becomes continuous. Consequently, the film on the substrates 15 may not be completely coated when the process initially indicates a continuous film thickness. Such differences between the films on the workpiece substrates 15 and the test substrates 73 advantageously can be determined by optical, microscopic inspection in routine methods of analysis.

Routine trials include timing the duration of the film deposition from the beginning of the process until a continuous film is first deposited on the test substrates 73. The process is then discontinued and the deposited films on the substrates 15 are analyzed. Initial data which indicate a difference in the time at which a continuous film is first formed on the substrates 15 and the test substrates 73 are then used to arrive at a proper correlation for a satisfactory film deposition on the workpiece substrates 15 in subsequent operations.

Once such a correlation is established, the described process and apparatus may be used to maintain optimum deposition parameters. Detrimental changes may be detected and corrected, wherein one such immediate correction may be to extend the time for forming a continuous film on the workpiece substrates 15. The availability and function of the monitoring chamber 52 consequently offers an in-process control for detecting process changes which are otherwise not detectable until after the completion of a process lot.

Additional Features and Cooperative Steps

Referring again to FIG. 1, the preferred embodiment of the invention shows monitoring chamber 51 and 52 and a helium supply 58 coupled to each of the monitoring chambers. Each of the monitoring chambers 51 and 52 has an opening 71 into the vacuum chamber 14 which is located at a distinct distance from a central axis 81 through the apparatus 10. Consequently, each monitoring chamber 51 and 52 is capable of also furnishing information which is indicative of a thickness profile of the deposited film with respect to the central axis 81 of the apparatus 10. Thus, in addition to the described respective monitoring chambers 51 and 52 further monitoring chambers may be added to the apparatus.

It may also be desired to couple a leak detector to each of the monitoring chambers 51 and 52. While using a separate leak detector 64 for each of the chambers appears desirable, a common leak detector is preferred for reasons of economy. A switching manifold valve 82 is therefore preferred in the duct 66 from the monitoring chambers to the leak detector 64. The valve 82 permits each of the monitoring chambers 51 and 52 to be tested in sequence to determine whether the established concentration level of helium continues to exist in the respective monitoring chamber.

In an alternate embodiment, typical state-of-the-art data processing equipment, such as any one of a number of commercially available microcomputers, a microcomputer 83 being shown in phantom lines in FIG. 1, may be added to evaluate received data from the monitoring chambers 51 and 52. An analog signal output from the leak detector 64 is therefore coupled through a signal line 84 to a typical analog to digital data interface of the microcomputer 83. The microcomputer 83 may then further be coupled by a control signal line 84 to the power source 32 to control the power source 32 as, for example, to shut down the operation of the apparatus 10, or to increase or decrease either the DC bias current or an AC current. The length of time required to form a continuous film on the test substrates 73 is monitored and recorded. The film deposition may be discontinued through a control signal to the power source 32 immediately upon an indication that a continuous film has been deposited on the test substrate 73. In a typical film deposition operation, however, the operation of the apparatus 10 is continued for a selected time after the leak detector 64 indicates that a continuous film has formed on the test substrate 73.

Using the valve 82 in lieu of separate leak detector sets becomes more economical in the apparatus 10 when the pallet 19 is exchanged for a different pallet containing more than two monitoring chambers. It is recognized that the use of a plurality of the monitoring chambers, such as the chamber 52, is desirable for controlling apparatus characteristics. On the other hand, the test substrates 73 covering the openings like diaphragms, take up valuable space on the surface 21 of the respective pallet. However, depending on the type of apparatus and the particular shape of the pallet 19 or susceptor, the inclusion of a plurality of monitoring chambers in addition to the chambers 51 and 52 may be desirable. In such an embodiment, the valve 82 sequentially switches to each one of such monitoring chambers to permit the leak detector to ascertain the helium concentration sequencially from each of such chambers.

FIG. 1 shows a duct 86 as a communicating passage between the leak detector and the vacuum chamber 14. Through the duct 86, sensing elements of the leak detector are, in one embodiment, coupled directly to the vacuum chamber 14. The duct 86 may either communicate directly between the leak detector 64 and the vacuum chamber 14, as it is shown in FIG. 1, or the duct may be routed through the sequential switching valve 82. Thus, in a first embodiment, the duct 86 is advantageously used as a differential information input. As a continuous film forms on the test substrates 73, the diffusion of helium atoms from the monitoring chambers 51 and 52 ceases. Consequently, in the monitoring chambers 51 and 52, the helium concentration begins to rise. In contrast the vacuum pump 36 continues to remove helium atoms from the vacuum chamber 14. Using, for example, the helium concentration in the monitoring chambers 51 and 52 as a datum, the concentration of helium in the vacuum chamber 14 is observed to decrease more rapidly with respect to the increasing level within the monitoring chambers than with respect to a steady state concentration level.

From the previous discussion of changes and improvements on the depicted apparatus 10, it should be apparent that various other changes and modifications to the apparatus and in the methods of forming thin continuous films are possible without departing from the spirit and scope of the invention described herein. In an alternate embodiment, for example, helium is introduced into the vacuum chamber 14 through the gas supply 38 as a mixture of and together with the ion source gas which is typically argon. The helium supply 58 is, in such embodiment, not coupled to the terminations 56 of the monitoring chambers. However, the helium diffuses through the permeable substrates 73 into the monitoring chambers. The concentration level of the helium within the monitoring chambers 51 and 52 is again monitored by the leak detector. The monitored gas samples may then be exhausted through the duct 86 directly into the vacuum chamber 14. When a continuous film has been formed on the substrates 73, a decrease of the helium concentration within the monitoring chambers 51 and 52 is observed by the leak detector 64. This latter embodiment may become particularly advantageous, when the ambient in the vacuum chamber is kept at a pressure higher than the gas pressure in the leak detector. Typically, commercial leak detectors include vacuum pumps to produce near vacuum conditions at their sensing elements.

Another modification relates to monitoring the presence of a continuous film by apparatus other than the described leak detector. While in the described embodiment, the leak detector senses and displays a concentration of helium within the monitoring chambers. It is within the scope and spirit of the invention to replace such a typical leak detector by a sensitive pressure monitor. Particular pressure readings may be made most advantageously by a differential pressure monitor using the vacuum chamber 14 as a reference basis through the duct 86 shown in FIG. 1.

What is claimed is:

1. A method of depositing a continuous film of material on a plurality of first substrates supported in a process chamber comprising:
   supporting in said process chamber adjacent to said plurality of first substrates a second, gas-permeable substrate above an opening to a communicating passage between the process chamber and a monitoring chamber, such that such second substrate covers the opening to the communicating passage;
   adding a monitoring gas to the atmosphere within a first one of the chambers while removing gas from the atmosphere of the second one of the chambers;
   depositing a film of a selected material on a surface of such second substrate and simultaneously therewith on surfaces of such first substrates within the process chamber;
   monitoring the level of the concentration of the monitoring gas within at least one of the chambers; and
   detecting a change in the level of the concentration of the monitoring gas as indicative of a continuous film having formed on the surface of the second substrate, such indication of a continuous film having formed on the second substrate indicating that a similarly continuous film has formed on the adjacent first substrates.

2. A method of depositing a continuous film of material according to claim 1, wherein the monitoring gas is helium, and adding a monitoring gas to the atmosphere of a first one of the chambers comprises releasing such helium at a predetermined rate from a sensitivity calibrator into the atmosphere of the first chamber from where it is permitted to diffuse through the second substrate until such time that a continuous film of material has formed on the second surface of the substrate.

3. A method of depositing a continuous film of material according to claim 1, wherein adding a monitoring gas to the atmosphere within a first chamber while removing atmosphere from the second chamber comprises releasing helium at a predetermined rate into the atmosphere of said first chamber while evacuating residual gases from said second chamber for the duration of depositing said film of the selected material on said surface of the second substrate.

4. A method of depositing a continuous film of material according to claim 1, wherein the monitoring gas is released at a predetermined leak rate into the monitoring chamber while the atmosphere is removed at least from the process chamber to maintain substantially a vacuum within the process chamber for the duration of depositing a film of selected material.

5. A method of depositing a continuous film of material according to claim 4, wherein monitoring the level of concentration of the monitoring gas within at least one of the chambers comprises sampling the atmosphere within at least one of the chambers with a mass spectrometer type leak detector.

6. A method of depositing a continuous film of material according to claim 5, wherein the mass spectrometer type leak detector samples the gas of the monitoring chamber.

7. A method of depositing a continuous film of material according to claim 6, wherein the monitoring gas is helium and the leak detector is calibrated to indicate the presence and concentration of helium.

8. A method of depositing a continuous film of material according to claim 7, which further comprises:
   timing the duration of carrying out the step of depositing a film of a selected material; and
   marking the time interval from the beginning of depositing a film of a selected material until such time that the leak detector first detects a change in the level of the helium concentration which is indicative of a continuous film having formed on the second surface of the substrate.

9. A method of depositing a continuous film of material according to claim 8 which further comprises continuing depositing a film of a selected material for a predetermined period of time past the marked time interval terminated by the leak detector first detecting a change in the level of the helium.

10. A method of depositing a continuous film of material according to claim 8 wherein the deposition of a film of a selected material is stopped at the end of the marked time interval indicating that a continuous film of minimum thickness has been deposited.

11. A method of depositing a continuous film of material according to claim 1, further comprising:
    recording the time span beginning with the time when the film of a selected material is first deposited on the surfaces of the first and second substrates and ending with a detection of a change in the level of the concentration of the monitoring gas.

12. A method of depositing a continuous film of material according to claim 11, which comprises discontinuing to deposit the film of a selected material at a predetermined time subsequent to the recorded time span.

13. Apparatus for depositing a continuous film of material on a plurality of substrates, which comprises:
    a first enclosure forming a process chamber;
    means for supplying a source material to the process chamber;
    means for supporting a plurality of first substrates within the process chamber;
    at least one monitoring chamber including at least one communicating passage terminating in an opening within the process chamber;
    means for depositing such source material on said substrates to form films thereon;
    at least one second, gas-permeable substrate, said gas-permeable substrate covering said opening of each such at least one passage for supporting such formed films of material thereon;
    means for diffusing a monitoring gas through the gas-permeable substrate; and
    means for monitoring the diffusion of said monitoring gas through the second, gas-permeable substrate and for indicating when such diffusion through the second, gas-permeable substrate ceases, such cessation being indicative of a continuous film of said material having been deposited.

14. Apparatus for depositing a continuous film of material according to claim 13, wherein said means for diffusing a monitoring gas through the substrate comprises:
    means coupled to said at least one monitoring chamber for supplying the monitoring gas to said monitoring chamber.

15. Apparatus for depositing a continuous film of material according to claim 14, wherein the monitoring means comprises a mass spectrometer type leak detector which is coupled to said at least one monitoring chamber for measuring a concentration level of such monitoring gas within such at least one monitoring chamber.

16. Apparatus for depositing a continuous film of material according to claim 14, wherein the means coupled to the at least one monitoring chamber for supplying the monitoring gas comprises a helium source type sensitivity calibrator having a known leak rate of helium gas, and the monitoring means comprises a mass spectrometer type leak detector which is coupled to the at least one monitoring chamber and is calibrated to measure the concentration level of helium within said at least one monitoring chamber.

17. Apparatus for depositing a continuous film of material according to claim 16, wherein said process chamber is a sputtering chamber and said means for supplying a source material is a target supported within the chamber and adapted to secure a quantity of target material which is to be sputtered.

18. Apparatus for depositing a continuous film of material according to claim 17, wherein:

such at least one monitoring chamber comprises at least two monitoring chambers, each of such at least two monitoring chambers terminating in such opening at a surface of a pallet capable of supporting a plurality of the first substrates in addition to such second, gas permeable substrates; and the apparatus further comprises means for sequentially coupling each of said at least two monitoring chambers to the leak detector.

19. Apparatus for depositing a continuous film of material according to claim 18, which comprises means for sequentially coupling the sputtering chamber and such monitoring chambers to the leak detector.

20. Apparatus for depositing a continuous film of material according to claim 13, wherein said means for diffusing a monitoring gas through the substrate comprises:

means, coupled to said process chamber, for supplying the monitoring gas to said process chamber, whereby the monitoring gas diffuses through said at least one substrate into said at least one monitoring chamber.

* * * * *

UNITED STATES PATENT AND TRADEMARK OFFICE
CERTIFICATE OF CORRECTION

PATENT NO. : 4,466,872
DATED : August 21, 1984
INVENTOR(S) : I. B. Einbinder

It is certified that error appears in the above—identified patent and that said Letters Patent is hereby corrected as shown below:

Column 6, line 51, "73," should read --73--. In the claims, Column 9, claim 2, line 42, "on the second surface of the substrate" should read --on the surface of the second substrate--. Column 10, claim 8, lines 13 and 14, "on the second surface of the substrate" should read --on the surface of the second substrate--.

Signed and Sealed this

Twenty-sixth Day of February 1985

[SEAL]

Attest:

DONALD J. QUIGG

Attesting Officer

Acting Commissioner of Patents and Trademarks